(12) United States Patent
Seo et al.

(10) Patent No.: US 7,365,571 B2
(45) Date of Patent: Apr. 29, 2008

(54) INPUT BUFFER WITH WIDE INPUT VOLTAGE RANGE

(75) Inventors: Dong-il Seo, Yongin-si (KR); Hyung-dong Kim, Suwon-si (KR); Jung-sik Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 311 days.

(21) Appl. No.: 11/037,083

(22) Filed: Jan. 19, 2005

(65) Prior Publication Data

US 2006/0001448 A1 Jan. 5, 2006

(30) Foreign Application Priority Data

Jul. 5, 2004 (KR) .................. 10-2004-0051975

(51) Int. Cl.
*H03K 19/094* (2006.01)
*H03K 19/0175* (2006.01)

(52) U.S. Cl. .................. 326/83; 326/80; 326/68; 326/82; 327/333; 327/77; 327/530

(58) Field of Classification Search .......... 326/83, 326/62, 80, 81, 82, 68, 86, 87; 327/77, 333, 327/530, 538, 843
See application file for complete search history.

(56) References Cited

U.S. PATENT DOCUMENTS

| | | | |
|---|---|---|---|
| 6,069,493 A * | 5/2000 | Pigott et al. .................. 326/83 |
| 6,172,524 B1 | 1/2001 | Cho ........................... 326/70 |
| 6,259,300 B1 * | 7/2001 | Yasuda et al. ............... 327/333 |
| 6,339,344 B1 * | 1/2002 | Sakata et al. ................. 326/83 |
| 6,507,223 B2 * | 1/2003 | Felder ......................... 327/77 |
| 6,750,684 B2 | 6/2004 | Lim ........................... 327/108 |
| 6,784,718 B2 * | 8/2004 | Okamoto et al. ............ 327/333 |
| 6,801,054 B2 | 10/2004 | Hirano ........................ 326/86 |
| 6,812,869 B1 | 11/2004 | Rahman et al. ............... 341/78 |
| 2004/0036526 A1 | 2/2004 | Lee ............................ 415/155 |
| 2004/0160639 A1 | 8/2004 | Furukawa ................... 358/1.16 |

FOREIGN PATENT DOCUMENTS

JP 2000-306382 A 11/2000

* cited by examiner

*Primary Examiner*—Rexford Barnie
*Assistant Examiner*—Crystal L Hammond
(74) *Attorney, Agent, or Firm*—Harness, Dickey & Pierce, P.L.C.

(57) ABSTRACT

The input buffer is driven by a data input/output supply voltage. The input buffer generates an output signal from an input signal that swings between the data input/output supply voltage and a data input/output ground voltage.

5 Claims, 4 Drawing Sheets

INPUT BUFFER WITH WIDE INPUT VOLTAGE RANGE

This application claims priority on Korean Patent Application No. 2004-51975, filed on Jul. 5, 2004, in the Korean Intellectual Property Office, the disclosure of which is incorporated by reference herein in its entirety.

BACKGROUND OF THE INVENTION

1. Field of the Invention

The present invention relates to a semiconductor memory device, and more particularly, to an input buffer.

2. Description of the Related Art

The voltage of signals input to a semiconductor memory device are specified by signal standards such as Stub Series Terminated Logic (SSTL), Low Voltage Transistor-Transistor Logic (LVTTL), and Low Voltage Complementary Metal Oxide Semiconductor (LVCMOS). For example, an interface for LVTTL or LVCMOS signals employs an input buffer having a CMOS inverter circuit with a full-swing amplitude corresponding to an operation voltage of the semiconductor device. Meanwhile, an interface for SSTL signals employs an input buffer using a differential amplifier circuit with a small swing amplitude from a reference voltage, which is a center voltage of the operation voltage. Therefore, in mass production, the two types of input buffers are formed to apply to various interfaces and one of the two is selected by a predetermined metal option.

FIG. 1 is a circuit diagram of a prior art input buffer for converting an input signal of a LVTTL standard into an internal CMOS signal. Referring to FIG. 1, an input buffer 100 includes a CMOS inverter circuit, which receives an input signal IN and generates an output signal OUT. The input buffer 100 uses an external supply voltage VDD or an internal supply voltage IVC as a power source, and generates a stable output signal OUT through an inverter. The inverter outputs a signal of a logic high or low level according to the supply voltage only when a voltage signal IN within a predetermined voltage range less than the supply voltage is received.

In a semiconductor memory device, the input voltage signal IN generally has the same voltage as a data output supply voltage VDDQ. If the data output supply voltage VDDQ is changed over a wide range with respect to the external supply voltage VDD or the internal supply voltage IVC, the input buffer 100, which uses the fixed external supply voltage VDD or internal supply voltage IVC as its power source, cannot accurately determine the voltage of an input signal IN exceeding the fixed supply voltage VDD or IVC.

As mentioned above, the input buffer for converting SSTL signals includes a differential amplifier circuit that compares an input signal with a reference voltage and determines the logic level of the input signal according to the difference between the input signal and the reference voltage, to thereby generate an output signal. The reference voltage is generally fixed at a center voltage between the fixed external supply voltage and ground. However, if the reference voltage is fixed based on the external supply voltage, determination of the logic level of the input signal may be inaccurate and the transition speed of the output signal from a low level to a high level differs from the transition speed of the input signal, causing signal skew.

SUMMARY OF THE INVENTION

The present invention provides an input buffer driven by a data input/output supply voltage. The input buffer generates an output signal from an input signal that swings between the data input/output supply voltage and a data input/output ground voltage.

In one embodiment, the input buffer includes an inverter connected between the data input/output supply voltage and a ground voltage. The inverter inverts the input signal to generate the output signal.

In another embodiment, the input buffer includes a buffer circuit and a control circuit. The buffer circuit is connected between a supply voltage and a ground voltage. The buffer circuit receives the input signal and generates the output signal. The control circuit receives the input voltage and generates the supply voltage based on the input voltage such that the supply voltage is greater than or equal to the input voltage.

In yet another embodiment of the present invention, the input buffer includes a differential amplifier connected between the data input/output voltage and a ground voltage. The differential amplifier generates the output signal based on a comparison of the input signal with a reference voltage.

In a still further embodiment, the input buffer includes a reference voltage generating circuit that generates the reference voltage based on the input signal. For example, the reference voltage generating circuit may include a control circuit generating a supply voltage based on the input signal, and a generating circuit generating the reference voltage based on the supply voltage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Hereinafter, embodiments of the present invention will be described in detail with reference to the appended drawings. Like reference numbers refer to like components throughout the drawings.

Figure 1:
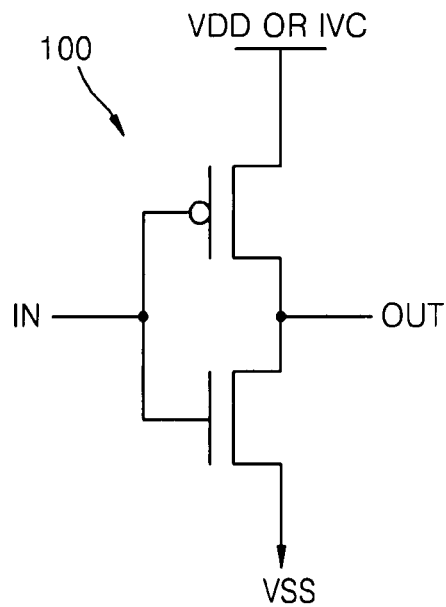
FIG. 1 is a circuit diagram of a prior art input buffer.
Figure 2:
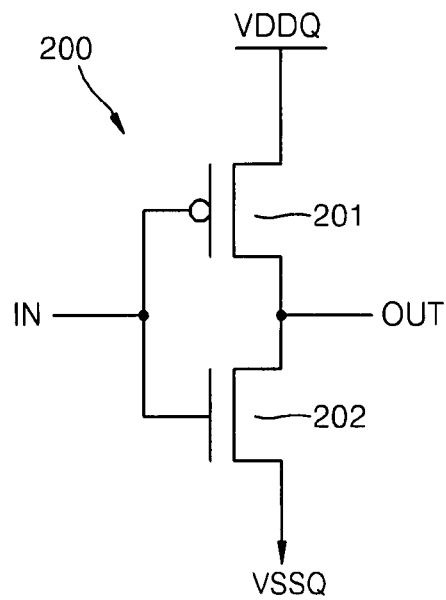
FIG. 2 is a circuit diagram of an input buffer according to a first embodiment of the present invention.

FIG. 2 is a circuit diagram of an input buffer according to a first embodiment of the present invention. Referring to FIG. 2, the input buffer 200 is a CMOS inverter including a PMOS transistor 201 and a NMOS transistor 202 connected in series between a data input/output supply voltage VDDQ and a ground voltage GND. The input buffer 200 receives an input signal IN and generates an output signal OUT. More specifically, if the difference between the potential of the input signal IN and the data input/output supply voltage VDDQ is lower than the threshold voltage of the PMOS transistor 201, then the PMOS transistor 201 will be turned on while the NMOS transistor 202 will be turned off. As a result, the data input/output supply voltage VDDQ is output as the output signal OUT. If the difference between the potential of the input signal IN and the ground voltage GND is greater than the threshold voltage of the NMOS transistor 202, then the NMOS transistor 202 will be turned on and the PMOS transistor 201 will be turned off. As a result, the output signal OUT is pulled down to the ground voltage GND.

The input signal IN is input to the input buffer 200 via a data input/output pad DQ (not shown). Data input to the data input/output pad DQ pull-swings from a data input/output ground voltage VSSQ to the data input/output supply voltage VDDQ. Therefore, the input signal IN also swings between the voltages VDDQ and VSSQ. If the input signal IN swinging between the voltages VDDQ and VSSQ is input to the input buffer 200 driven by the voltage VDDQ as shown in FIG. 2, an inversion of the input signal IN is output as the output signal OUT. Therefore, the problem that an input buffer using a fixed external supply voltage VDD or internal supply voltage IVC as a power source receives an input signal IN with a voltage above the voltage driving the input buffer does not exist in this embodiment of the present invention.

Figure 3:
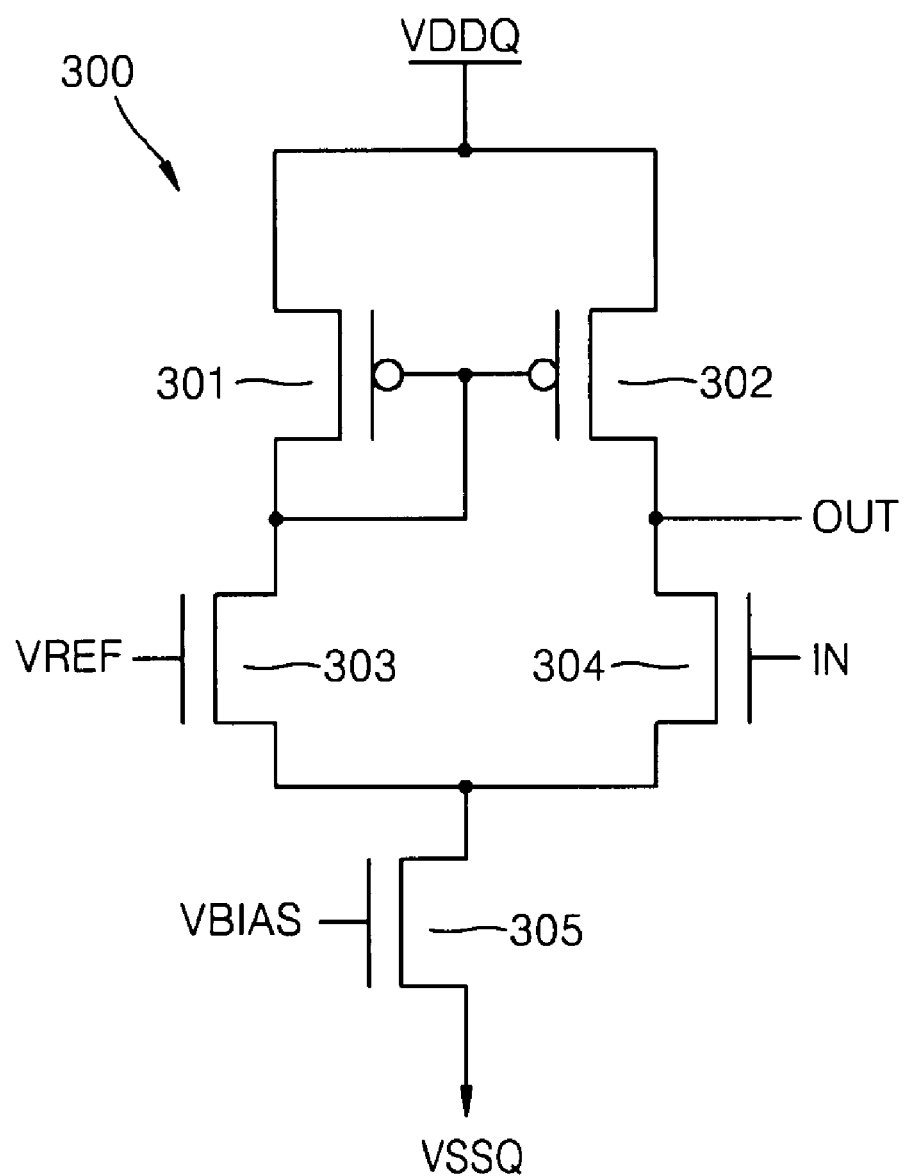
FIG. 3 is a circuit diagram of an input buffer according to a second embodiment of the present invention.

FIG. 3 is a circuit diagram of an input buffer according to a second embodiment of the present invention. Referring to FIG. 3, an input buffer 300 includes a differential amplifier circuit connected between a data input/output supply voltage VDDQ and a ground voltage GND. The input buffer 300 includes first and second PMOS transistors 301, 302 whose sources are connected to the data input/output supply voltage VDDQ and whose gates are connected to form a current mirror. A first NMOS transistor 303 has its drain connected to the gate and drain of the first PMOS transistor 301 and has its gate connected to a reference voltage VREF. A second NMOS transistor 304 has its drain connected to the drain of the second PMOS transistor 302 and has its gate receiving an input signal IN. A third NMOS transistor 305 has its drain connected to the sources of the first and second NMOS transistors 303, 304 and has its gate connected to a bias voltage VBIAS such that a constant current flows through the third NMOS transistor 305.

If the potential of the input signal IN is greater than the reference voltage VREF, then more current will flow through the second NMOS transistor 304 than through the first NMOS transistor 303. As a result, the output signal OUT is pulled down to the ground voltage GND. If the potential of the input signal IN is less than the reference voltage VREF, then more current flows through the first NMOS transistor 303 than through the second NMOS transistor 304. As a result, the output signal OUT is pulled up to the data input/output supply voltage VDDQ.

Since the input signal IN received via a data input/output pad DQ (not shown) swings between the voltages of VDDQ-VSSQ, the input buffer 300 driven by the data input/output supply voltage VDDQ (as received by the first and second PMOS transistors 301 and 302) properly outputs an inversion of the input signal IN as an output signal OUT.

Figure 4:
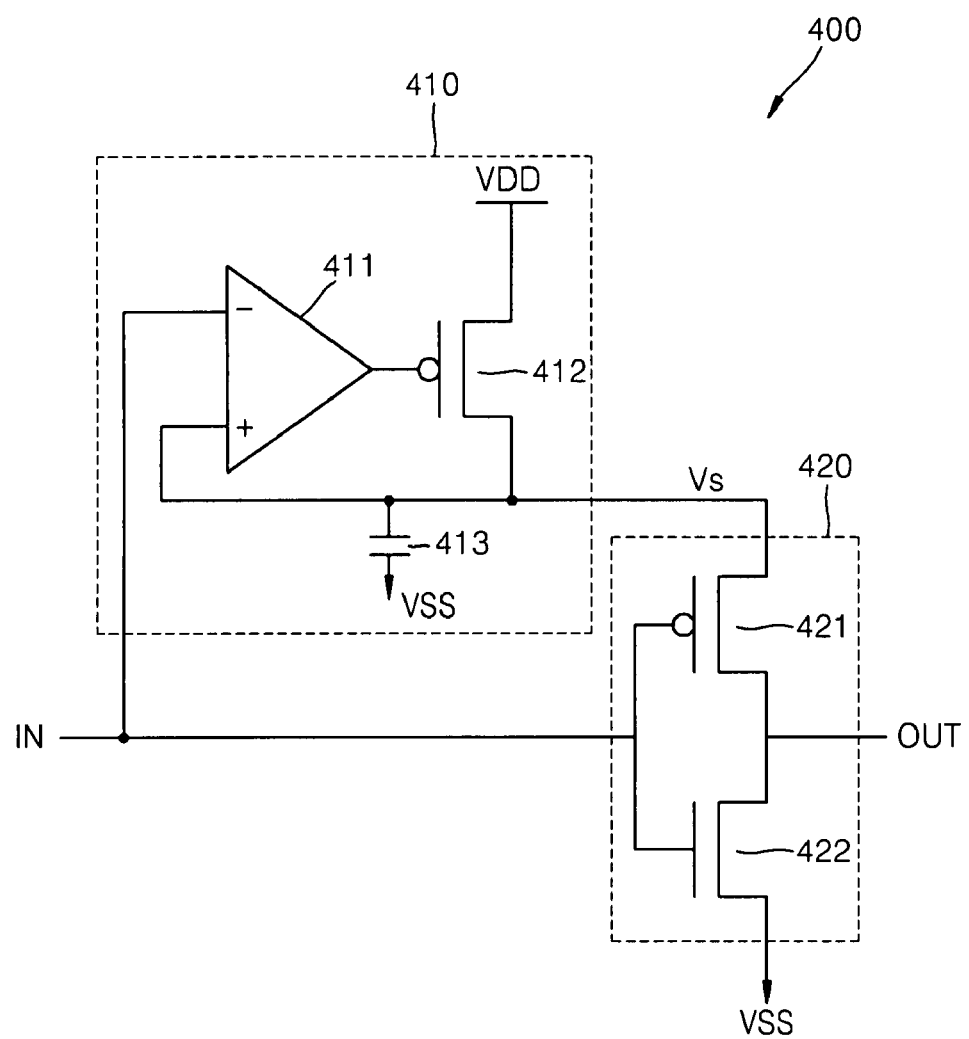
FIG. 4 is a circuit diagram of an input buffer according to a third embodiment of the present invention.

FIG. 4 is a circuit diagram of an input buffer according to a third embodiment of the present invention. Referring to FIG. 4, an input buffer 400 includes a supply voltage detection and maintenance unit 410 and an inverter 420. The supply voltage and maintenance unit 410 includes a comparator 411 for comparing an input signal IN with an input buffer supply voltage Vs; a PMOS transistor 412 whose source is connected to a supply voltage VDD and whose gate is connected to an output terminal of the comparator 411; and a capacitor 413 connected between the drain of the PMOS transistor 412 and a ground voltage GND.

The comparator 411 compares the input signal IN with the input buffer supply voltage Vs and outputs a signal of a logic low level if the voltage of the input signal IN is higher than the input buffer supply voltage Vs. The PMOS transistor 412 is turned on in response to the logic low level signal received from the comparator 411, and the capacitor 413 is charged by a supply voltage VDD supplied through the PMOS transistor 412. If an input buffer supply voltage Vs generated by the charged capacitor 413 is greater than or equal to a maximum possible input signal IN voltage, an output signal of the comparator 411 is changed to a logic high level, which turns off the PMOS transistor 412. As will be appreciated, the capacitor 413 may thus be charged such that the supply voltage Vs is greater than or equal to the input signal IN and may eventually be charged up to a maximum possible voltage (e.g., the data input/output supply voltage) of the input signal IN.

The inverter 420 operates in the same manner as the input buffer 200 described with respect to FIG. 2 except that the input buffer supply voltage Vs is output when the PMOS transistor 421 is turned on.

Since the supply voltage detection and maintenance unit 410 ensures that the input buffer supply voltage Vs is the maximum possible voltage of the input signal IN, the inverter 420 is in essence driven by the data input/output supply voltage and correctly outputs an inversion of the input signal IN as an output signal OUT.

Figure 5:
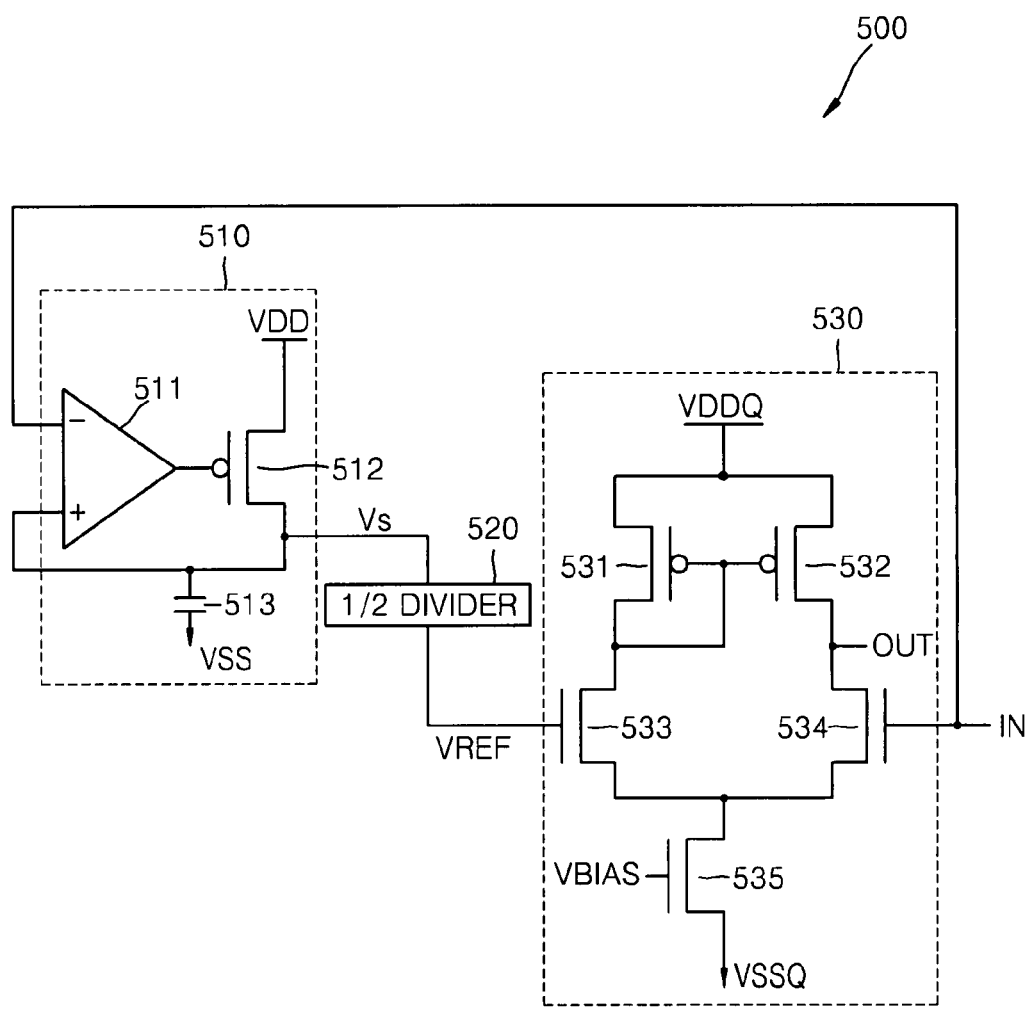
FIG. 5 is a circuit diagram of an input buffer according to a fourth embodiment of the present invention.

FIG. 5 is a circuit diagram of an input buffer according to a fourth embodiment of the present invention. Referring to FIG. 5, an input buffer 500 includes a reference voltage generating circuit formed by a supply voltage detection and maintenance unit 510 and a ½ divider 520, and includes a buffer circuit formed by a differential amplifier circuit 530. The supply voltage detection and maintenance unit 510 includes a comparator 511 for comparing an input signal IN with an input buffer supply voltage Vs, a PMOS transistor 512 for responding to an output of the comparator 511, and a capacitor 513 connected between the input buffer supply voltage Vs and a ground voltage GND.

The comparator 511 compares the input signal IN with the input buffer supply voltage Vs, and outputs a signal of a logic low level if the voltage of the input signal IN is higher than the input buffer supply voltage Vs. The PMOS transistor 512 is turned on in response to the logic low level signal received from the comparator 511, and thus the capacitor 513 is charged by a supply voltage VDD. If an input buffer supply voltage Vs generated by the charged capacitor 513 is greater than or equal to the input signal IN, the comparator 511 outputs a signal of a logic high level, which turns off the PMOS transistor 512. As will be appreciated, the capacitor 513 may thus be charged such that the supply voltage Vs is greater than or equal to the input signal IN and may eventually be charged up to a maximum possible voltage of the input signal IN.

The input buffer supply voltage Vs is halved to generate a reference voltage VREF by the ½ divider 520. As will be appreciated, the reference voltage VREF may thus correspond to half of the maximum possible voltage of the input signal IN. The differential amplifier circuit 530 operates in the same manner as the input buffer 300 described with respect to FIG. 3. Accordingly, the differential amplifier circuit 530 can accurately determine the logic level of the input signal IN when comparing it to the reference voltage VREF. Also, since the input signal IN received via a data input/output pad DQ pull-swings between a voltage level of VDDQ and VSSQ, the differential amplifier circuit 530 driven by the data input/output supply voltage VDDQ voltage can operate more stably.

Therefore, according to the input buffer of the present invention, by using a data input/output supply voltage, which is a maximum input voltage, as a power source voltage or using a supply voltage that changes according to the input signal voltage, it is possible to accurately determine the logic levels of input signals having a wide range.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. An input buffer driven by a data input/output supply voltage to generate an output signal from an input signal that swings between the data input/output supply voltage and a data input/output ground voltage, the input buffer comprising:
   a differential amplifier connected between the data input/output voltage and a ground voltage, and generating the output signal based on a comparison of the input signal with a reference voltage; and
   a reference voltage generating circuit generating the reference voltage based on the input signal, the reference voltage generating circuit including a generating circuit and a control circuit, the control circuit including,
      a comparison circuit comparing the input signal with a supply voltage;
      a capacitor supplying the supply voltage; and
      a charging circuit that charges the capacitor based on output of the comparison circuit.

2. The input buffer of claim 1, wherein the a control circuit generates the supply voltage based on the input signal and the generating circuit generates the reference voltage based.

3. The input buffer of claim 2, wherein the control circuit compares the input signal with the supply voltage and generates the supply voltage based on the comparison.

4. The input buffer of claim 2, wherein the generating circuit divides the supply voltage in half to obtain the reference voltage.

5. The input buffer of claim 1, wherein the generating circuit divides the supply voltage in half to obtain the reference voltage.

* * * * *